(12) United States Patent
Hellig et al.

(10) Patent No.: US 6,979,651 B1
(45) Date of Patent: Dec. 27, 2005

(54) METHOD FOR FORMING ALIGNMENT FEATURES AND BACK-SIDE CONTACTS WITH FEWER LITHOGRAPHY AND ETCH STEPS

(75) Inventors: Kay Hellig, Dresden (DE); Douglas J. Bonser, Hsin-Chu (TW); Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 79 days.

(21) Appl. No.: 10/207,653

(22) Filed: Jul. 29, 2002

(51) Int. Cl.[7] .................................... H01L 21/311
(52) U.S. Cl. ............................ 438/694; 438/723
(58) Field of Search ...................... 438/694, 700, 438/702, 703, 719, 723, 724, 725

(56) References Cited

U.S. PATENT DOCUMENTS

| | | | |
|---|---|---|---|
| 5,308,783 A * | 5/1994 | Krautschneider et al. ... | 438/237 |
| 5,633,190 A | 5/1997 | Sugiyama | |
| 5,643,822 A * | 7/1997 | Furukawa et al. ......... | 438/421 |
| 5,702,976 A * | 12/1997 | Schuegraf et al. ......... | 438/424 |
| 5,807,789 A * | 9/1998 | Chen et al. ............... | 438/714 |
| 5,817,560 A * | 10/1998 | Gardner et al. ........... | 438/301 |
| 5,830,797 A | 11/1998 | Cleeves | |
| 5,963,816 A | 10/1999 | Wang et al. | |
| 6,001,696 A | 12/1999 | Kim et al. | |
| 6,037,236 A | 3/2000 | Jang | |
| 6,043,133 A | 3/2000 | Jang et al. | |
| 6,207,530 B1 | 3/2001 | Hsu et al. | |
| 6,281,539 B1 | 8/2001 | Mandelman et al. | |
| 2003/0008472 A1 | 1/2003 | Yoshimura et al. | |

* cited by examiner

Primary Examiner—Kin-Chan Chen

(57) ABSTRACT

The method performs a first photolithography and etch to form shallow trench isolation features and alignment mark features into the top SOI layer. The shallow trenches are then filled with a dielectric material to form the isolation. A second lithography and etch step is then applied to etch the window locations for back-side contacts, and to transfer the alignment marks down into the SOI lower substrate. After this first lithography and etch step, the alignment marks in the top silicon may be used for alignment of the second lithography mask and etch. This is made possible by leaving the polish stop layer on the wafer, which serves to increase the optically effective thickness of the alignment mark pattern. The polish stop layer is removed after the second etch process. The teachings can be applied to any Semiconductor-On-Insulator-type wafer/technology where the top semiconductor layer is not thicker than the optimum alignment mark depth.

15 Claims, 14 Drawing Sheets

METHOD FOR FORMING ALIGNMENT FEATURES AND BACK-SIDE CONTACTS WITH FEWER LITHOGRAPHY AND ETCH STEPS

FIELD OF THE DISCLOSURE

The present invention relates generally to a semiconductor manufacturing process, and more particularly to a method for formation of alignment features and back-side contacts on a device.

BACKGROUND

Wafers utilizing Semiconductor-On-Insulator (SOI) technology are generally composite structures consisting of an active layer of silicon deposited on insulating materials. The insulator, or dielectric, can be sapphire, silicon dioxide, silicon nitride, or other insulating form of silicon. Composition of a SOI wafer prior to processing typically consists of a stack as illustrated in FIG. 1, which illustrates a cross-sectional view of a portion 100 of a SOI wafer with a top silicon layer 16 for fabricating a fully depleted SOI technology semiconductor device. Portion 100 includes a lower or support substrate 12, a buried insulative layer 14, as well as thin top silicon layer 16. Insulative layer 14 is generally a buried oxide (BOX) layer that serves as an insulating layer between the support substrate 12 and the top silicon layer 16. Depending upon the processing technology and device requirements, the thickness of the upper or top silicon layer 16 may vary between 5 and 200 nm or more. The portion 100 shown in FIG. 1 serves as the basis or foundation needed to begin the device fabrication procedures or process flow, e.g., series of photolithography and etch processes for alignment mark formation, STI formation, back side contact formation, and the like.

In the manufacture of devices employing SOI technology, formation of alignment marks is typically the first step. Formation of alignment marks is necessary because in subsequent lithography operations, e.g., shallow trench isolation (STI) feature formation, the wafer must be positioned such that the pattern exposed into the photo resist from previous lithography operations aligns properly. If the SOI top layer silicon 16 is significantly thinner than the required, or optimum, alignment mark depth, e.g., 10 nm top silicon layer thickness and 120 nm optimum depth for step/scan contrast, it is not possible to use alignment marks formed only in the top silicon layer 16, or in the insulative layer 14, as insufficient contrast for the pattern alignment process would exist. For this reason, the alignment marks must be formed in the lower substrate silicon 12. Alignment marks are formed by an exposure, without alignment, followed by an etch process, which transfers the resist pattern into the wafer silicon substrate 12. The alignment marks formed in the substrate 12 have an optimal depth D (seen in FIG. 13), dependant upon specific pattern alignment equipment, to provide a desired level of contrast for the optical pattern alignment system. For example, step and scan alignment systems manufactured by ASML have an optimum depth of about 120 nm, while systems manufactured by others, e.g., Canon, Nikon, etc., have a different optimum depth.

The conventional alignment mark formation process requires two lithography and etch steps, as discussed with reference to FIGS. 2 and 3. Following alignment mark formation, an STI pattern is transferred into the top silicon layer 16 through a third lithography and etch step, as presented with reference to FIGS. 4 and 5.

FIG. 2 illustrates a cross-sectional view of the portion 100 of the SOI wafer of FIG. 1 after thermal growth of pad oxide layer 15, nitride layer 17 deposition, and the first photolithography masking and etch of the nitride/oxide/silicon/oxide stack to form location or window 5 for later alignment feature patterns. In addition, the photo resist mask has been removed from portion 100 in FIG. 2. This first photolithography and etch step uncovers the upper surface of substrate silicon 12 and forms the window location 5. Portion 100 will then be masked with the alignment pattern, and an etch into the lower or support substrate 12 will be conducted, with the result illustrated in FIG. 3.

FIG. 3 illustrates portion 100 of FIG. 2 after the second lithography and etch step and removal of the second photo resist mask. The second mask is used to image or pattern the location of alignment features 7 where window 5 had been formed in the first etch step. An etch to form the alignment features 7 is conducted into the lower or support substrate 12 to a desired depth, e.g., the desired, or predefined, depth for proper stepper/scanner contrast. With the creation of alignment features 7, portion 100 can now undergo a third mask and etch step to form shallow trench isolation feature patterns, as seen in FIG. 4.

FIG. 4 illustrates portion 100 of FIG. 3 after the third lithography and etch step, and removal of the photo resist mask. Shallow trench patterns are masked, utilizing the alignment features 7 for alignment to assure proper positioning, and then openings 9 are etched through nitride layer 17, pad oxide layer 15, and top silicon layer 16 to form STI trenches. During the STI etch, the photo resist defining the location of openings 9 (not shown) protects the alignment features 7. Etch of openings 9 is stopped upon reaching the buried oxide layer 14. Portion 100 is ready to undergo trench fill and planarization, as shown in FIG. 5.

FIG. 5 illustrates portion 100 of FIG. 4 after trench fill, planarization, and removal of nitride layer 17 and pad oxide layer 15. Silicon oxide 8 is used to fill the trench openings 9, as well as to cover the alignment features 110. The silicon oxide fill 8 is then planarized, i.e., undergoes chemical mechanical polishing, and removal of nitride layer 17 and pad oxide layer 15 is accomplished. The portion 100 illustrated in FIG. 5 has, thus far, undergone three separate lithography and etch steps of the process flow in order to pattern alignment features 110 into substrate 12 and create STI features 10 in the thin top silicon layer 16.

In addition to the formation of alignment marks and STI features, in SOI technology it is customary to form some electrical contacts to the "back side" of the wafer, i.e., to the substrate 12 beneath the insulating buried oxide layer 14. This is required to ensure that the potential at the top silicon/buried oxide interface is kept at a constant value instead of being allowed to "float." To obtain good ohmic contact, the contacted substrate area must undergo a silicidation process. In conventional processing, a window for the back-side contact is etched through the trench isolation and barrier oxides before silicide formation, which is normally done for the source/drain and gate regions. FIGS. 6 and 7 detail the SOI process flow sequence for forming the back-side contact window, which adds an additional lithography and etch step to the SOI process flow illustrated in FIGS. 2 through 5.

Referring now to FIG. 6, which illustrates a cross-sectional view of a portion 200 of a SOI wafer which has undergone the first, second, and third lithography and etch steps of the process flow such as presented with reference to FIGS. 2 through 5, to form STI features in top silicon layer 26 and alignment features in substrate 22. A photo resist mask 20 is applied over portion 200 to form an opening 21 which will serve as the back-side contact window after etch through buried oxide 24, as seen in FIG. 7. It should be noted that gate structures and implants for source/drain regions are not depicted in FIG. 6 (or FIG. 7) in order to keep portion 200 straightforward and uncluttered.

FIG. 7 illustrates the portion 200 of FIG. 6 after the lithography and etch steps and resist removal. The etch creates a back-side window 25. Back-side window 25 extends through buried oxide 24 to substrate 12, and serves as the location at which the back-side contact will be formed in subsequent processing, i.e., silicidation.

To reach the point in the SOI process flow represented by FIG. 7 has required four lithography and etch processes, as discussed with reference to FIGS. 2 through 7. Thus when a thin silicon upper layer is used, considerably more manufacturing capacity and cycle time is required than that of processing of SOI with a medium SOI top layer thickness, where two lithography and etch steps are required. The thin SOI upper layer case also requires more manufacturing capacity and cycle time than the case of thick top layer or bulk material, in which three and two lithography and etch steps are needed respectively. However, in terms of device performance, it is desirable to use thin SOI top layers, as thin SOI top layers enable formation of fully depleted SOI devices, e.g., devices that have lower leakage currents.

A method to reduce the number of lithography and etch steps needed to form alignment marks, STI patterns, and back-side contact windows in SOI wafers would be useful and could reduce manufacturing cycle time while increasing manufacturing capacity.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements for clarity. Other advantages, features and characteristics of the present disclosure, as well as methods, operation and functions of related elements of structure, and the combinations of parts and economies of manufacture, will become apparent upon consideration of the following description and claims with reference to the accompanying drawings, all of which form a part of the specification, wherein like reference numerals designate corresponding parts in the various figures, and wherein:

DETAILED DESCRIPTION OF THE FIGURES

FIGS. 8 through 25 illustrate a method to reduce the number of process steps, such as lithography and etch, needed to form alignment marks, STI patterns, and back-side contact windows in SOI technology in an integrated circuit. In an embodiment, a first photolithography and etch are performed to form openings for shallow trench isolation features and alignment mark features into a top SOI layer. This first photolithography step also opens windows in the top SOI layer, which later serve to mark the locations for back-side contact formation. The shallow trenches are then filled with a dielectric material to form the isolation features. A second lithography and etch step is then applied to etch the window locations for back-side contacts, as well as to transfer the alignment marks down into the SOI lower substrate. Subsequent to the first lithography and etch step, the alignment marks in the top silicon may be used for alignment of the second lithography mask and etch. In the various embodiments, this is made possible by leaving the polish stop layer (dielectric layer) on the wafer, which serves to increase the optically effective thickness of the alignment mark pattern. The polish stop layer is removed after the second etch process. The teachings herein can be applied to any Semiconductor-On-Insulator-type wafer/technology where the top semiconductor layer is not thicker than the optimum alignment mark depth.

Figure 1:
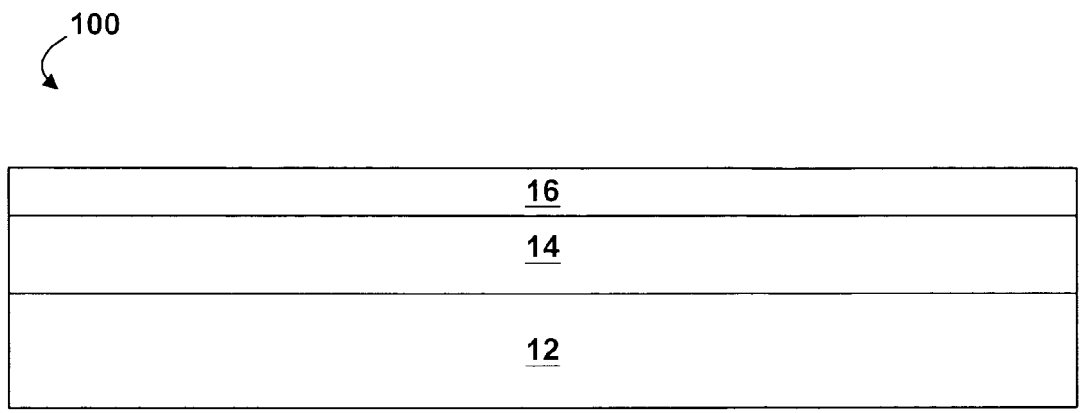
FIG. 1 illustrates an unprocessed cross-sectional view of a portion of a SOI wafer.
Figure 2:
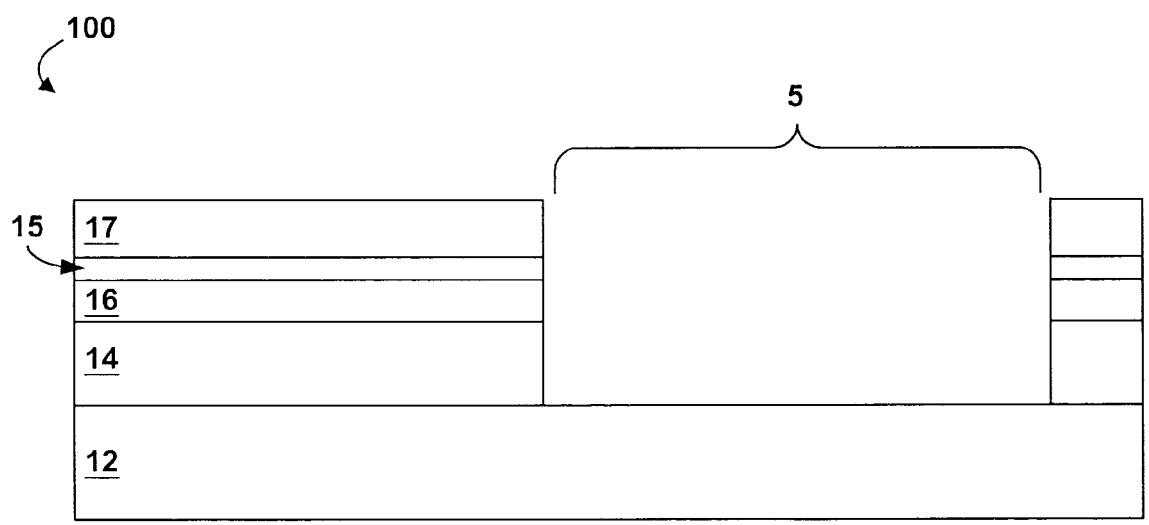
FIGS. 2–7 illustrate, in cross-section, semiconductor device manufacturing process steps according to the prior art.
Figure 3:
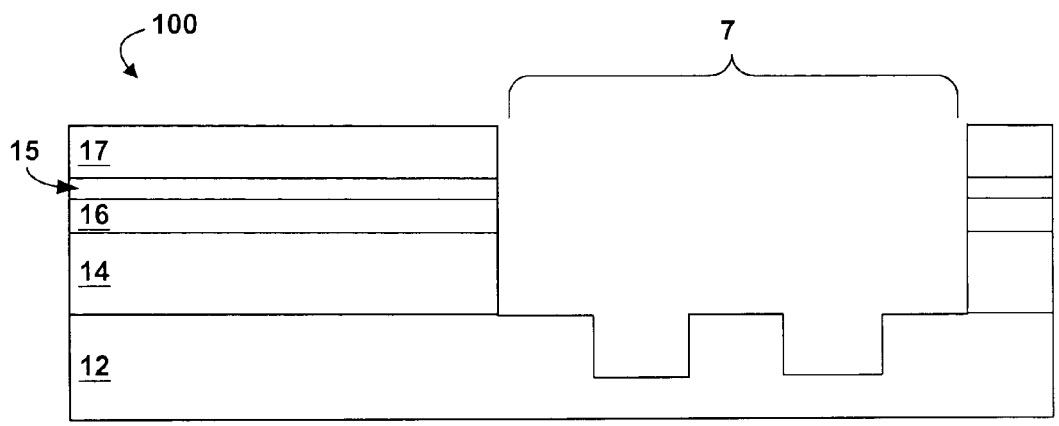
Figure 4:
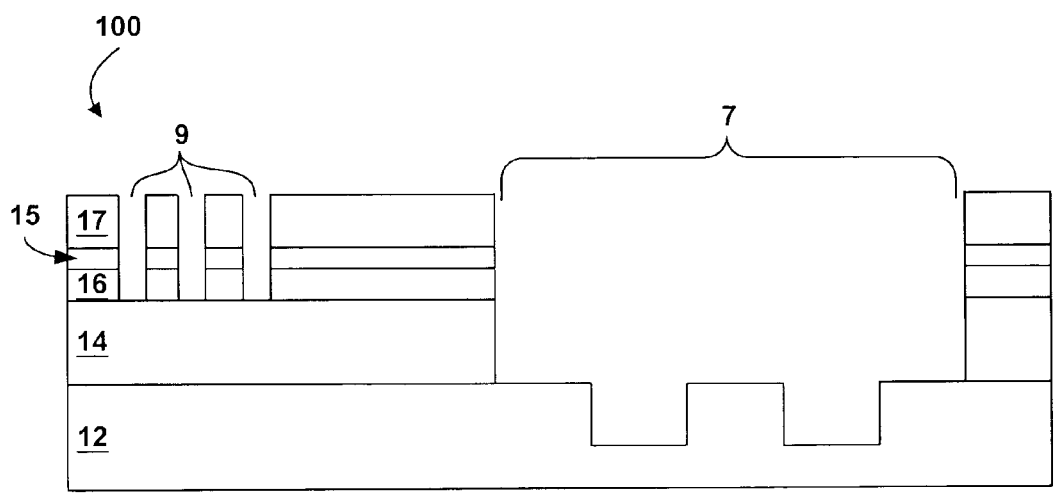
Figure 5:
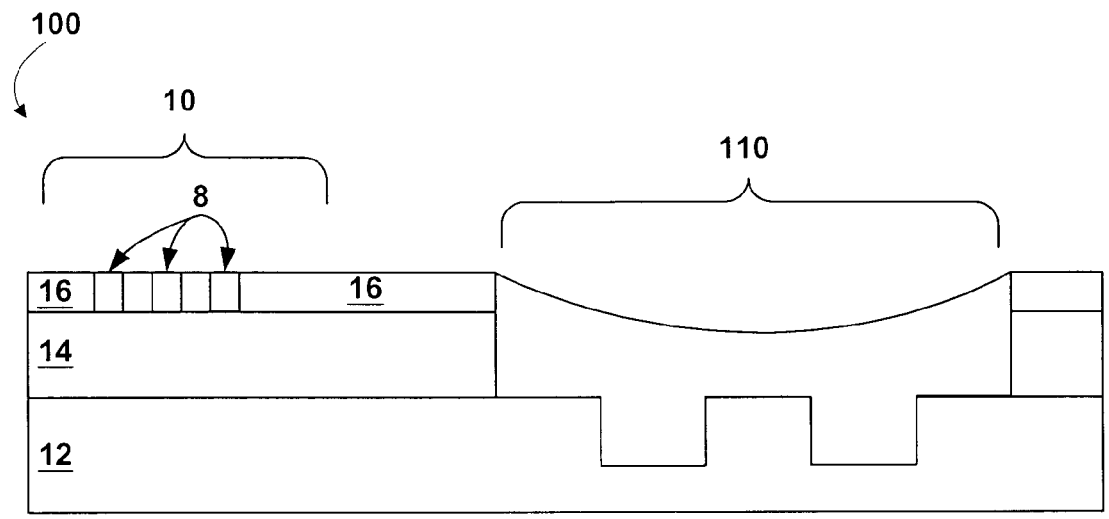
Figure 6:
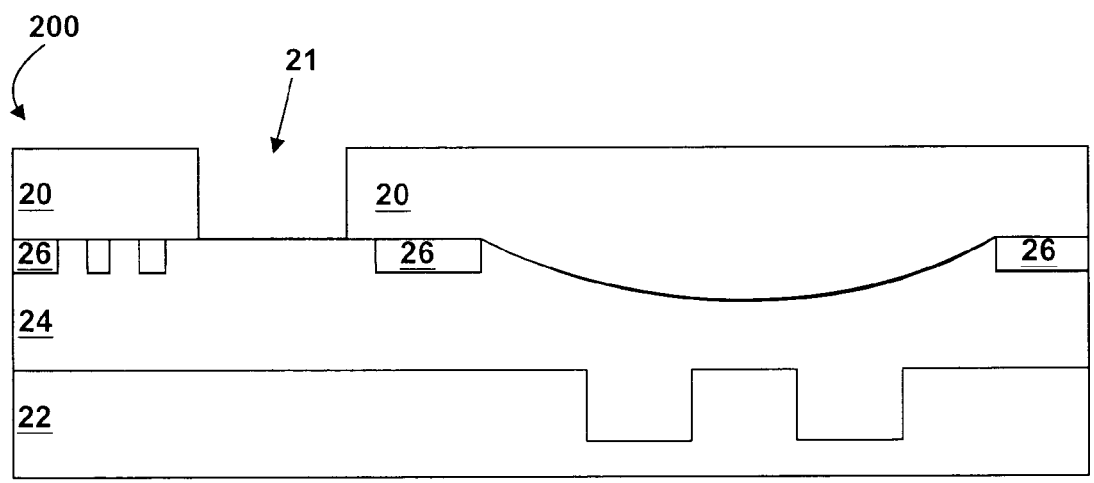
Figure 7:
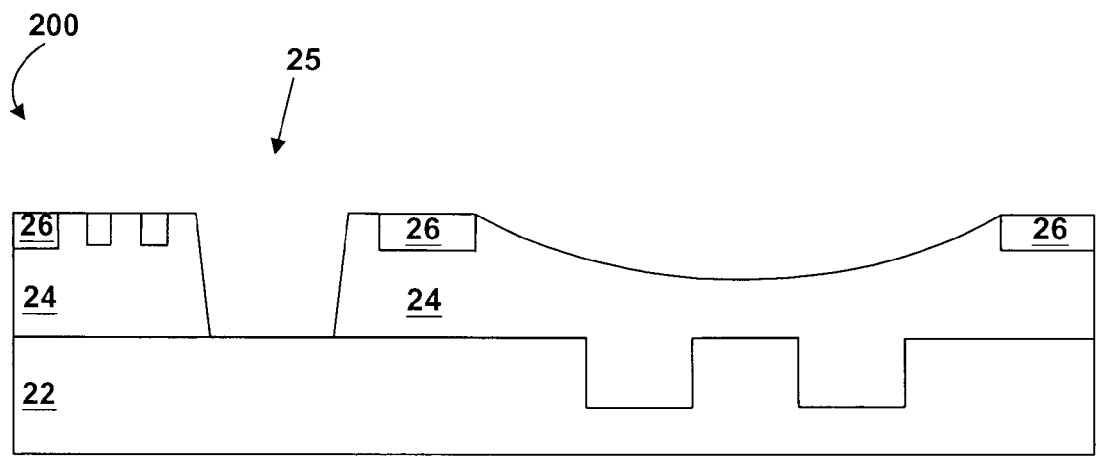
Figure 8:
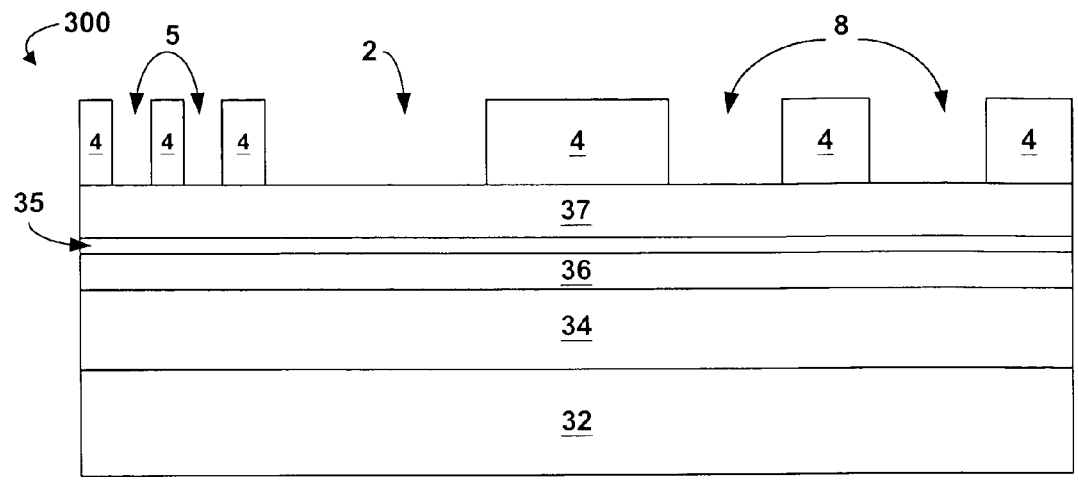
FIGS. 8–25 illustrate, in cross-section, semiconductor device manufacturing process steps according to at least one embodiment of the present disclosure.

Shown in FIG. 8 is a portion 300 of a semiconductor device comprising an STI layer stack formed on an SOI wafer substrate. An SOI substrate as disclosed herein typically consists of a lower substrate 32, an insulative layer 34, and a top silicon layer 36. A buffer layer 35 may be employed, although the use of buffer layer 35 is optional. The SOI substrate is preferably silicon-on-insulator. Alternatively, SOI Substrate can also be a semiconductor-on-insulator substrate, a silicon on sapphire substrate, or the like. Insulative layer 34 is preferably a buried oxide (BOX).

In the embodiment shown in FIG. 8, the STI film stack over SOI substrate stack comprises buffer layer 35 and a dielectric layer 37. Buffer layer 35 has a thickness ranging between 5 to 20 nm, and is generally formed of silicon dioxide, preferably through a thermal oxidation process. It should be noted that the use of buffer layer 35 is not required to practice the embodiments as disclosed herein. Following the formation of buffer layer 35, dielectric layer 37 is formed over buffer layer 35. Dielectric layer 37 is preferably LPCVD or PECVD deposited silicon nitride having a thickness ranging from 50 to 200 nm. Alternatively, dielectric layer 37 can also be another material, such as silicon oxynitride. Dielectric layer 37 will serve as a STI polish stop layer in the various embodiments of the present disclosure.

A photo resist mask 4 has been formed over the SOI substrate stack and STI stack. The resist mask 4 has an opening 2 defining a location of a back-side contact, as well as openings 8 defining a location of an alignment feature. Further, photo resist mask 4 has openings 5 defining a location of a shallow trench isolation (STI) feature. The lithography process to which portion 300 will be subjected is carried out using alignment of the wafer shape only i.e., center finding and notch finding, since there are no alignment features on a pristine wafer. Commonly, the STI stack, and especially the dielectric layer 37, acts as an anti-reflective layer during the lithography process.

Figure 9:
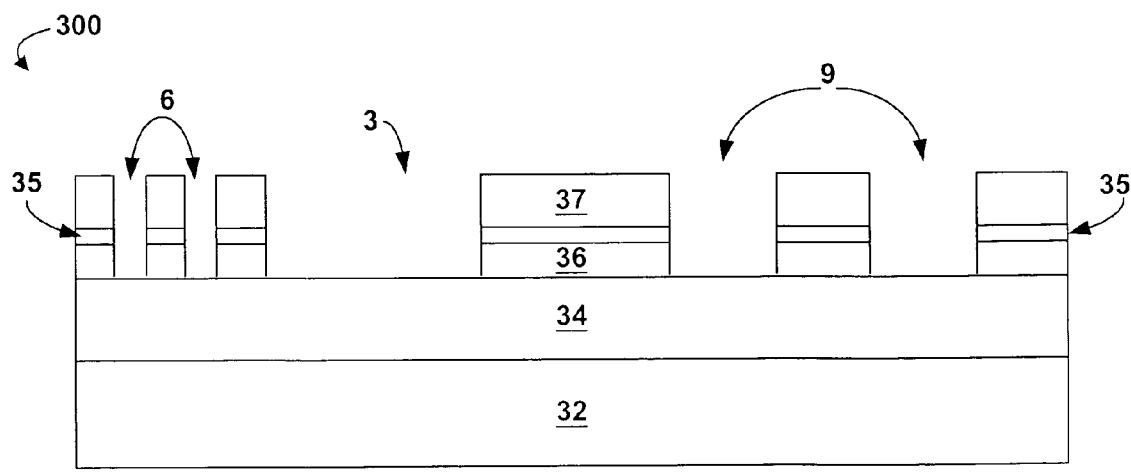

In FIG. 9, the portion 300 of FIG. 8 has been etched in a multi-step, anisotropic dry etch process. The etch process used is typical to that employed for STI etch on SOI material. This multi-step etch transfers the resist mask (4, FIG. 8) pattern into the STI film stack and top silicon layer 36. The etch process is halted upon reaching, or upon etching a small distance into, insulative layer 34. The resist mask is then removed, as seen in FIG. 9. The STI etch on SOI material forms at least a portion of the back-side contact opening by etching each of top silicon layer 36, dielectric layer 37, and buffer layer 35. As well, the STI etch forms at least a portion of an alignment feature by etching each of top silicon layer 36, dielectric layer 37, and buffer layer 35. The STI feature 6 is formed at least partially simultaneously with formation of a portion of the alignment feature openings 9 and back-side contact opening location 3. Following formation of STI feature 6, portion of alignment feature 9, and window 3 for back-side contact into the STI stack of nitride/oxide/top silicon, the STI trench features 6 will be filled and planarized, as seen in FIG. 10.

Figure 10:
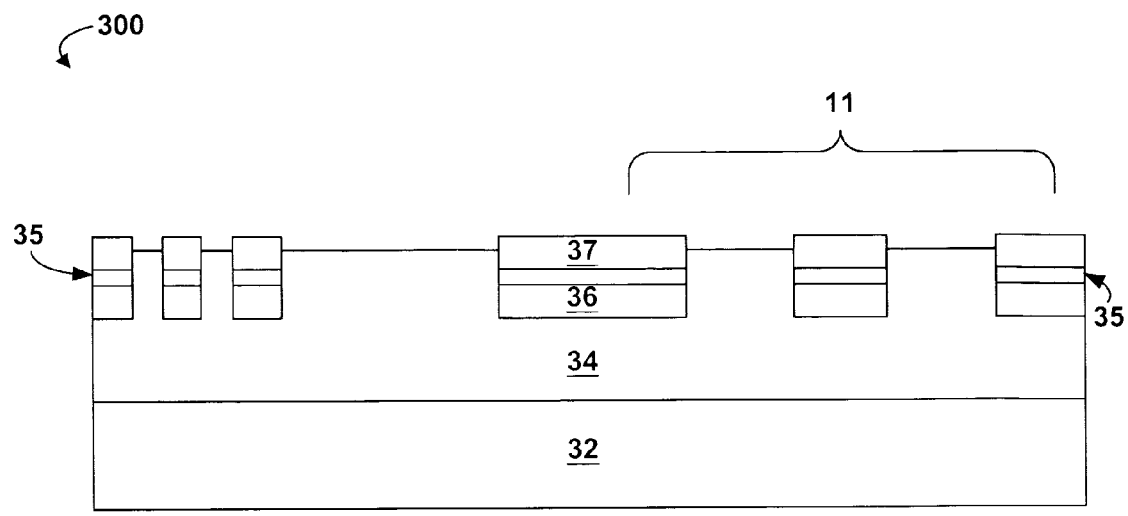
Figure 11:
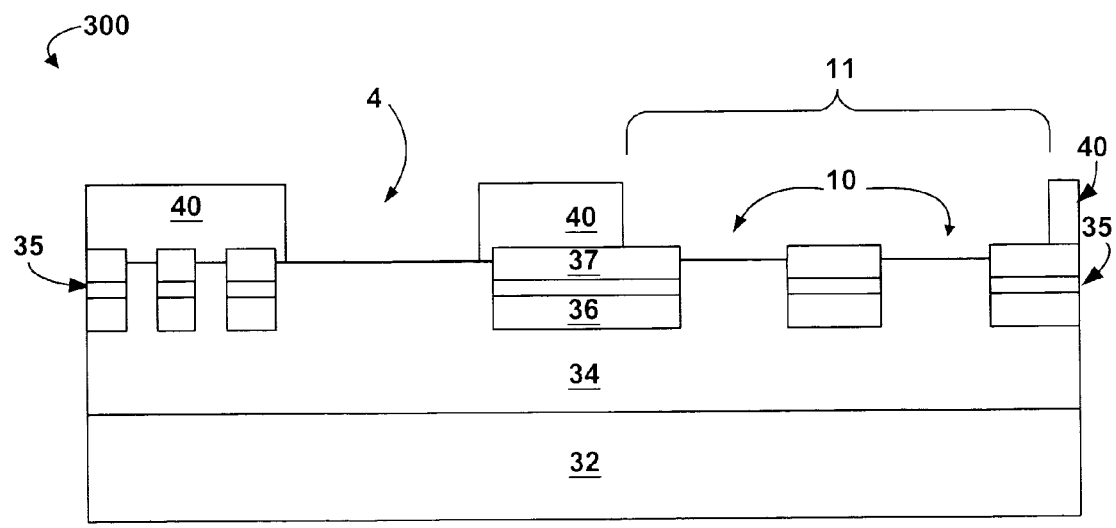

FIG. 10 shows the portion 300 of FIG. 9 after STI trench fill with silicon oxide, followed by planarazation using a chemical mechanical polish (CMP). The CMP step thins the dielectric layer 37, and typically leaves a step from the uppermost surface of the dielectric layer 37 to the uppermost surface of the trench fill (silicon oxide). The alignment features 11 etched into top silicon layer 36 will be used to align the wafer during a second lithography step, as seen in FIG. 11. Typically, a thin top silicon layer such as layer 36 may not provide sufficient contrast for alignment, however, the remaining dielectric layer 37 provides for sufficient contrast to conduct alignment because of the added thickness over the silicon layer 36 from remaining layer 37, as well as the anti-reflective properties of the dielectric layer 37 itself.

FIG. 11 illustrates the portion 300 of FIG. 10 after lithographic masking with 'dual window' mask 40. Dual window mask 40 is preferably a photo resist mask for patterning openings 4 for back-side contacts and openings 10 for alignment features. For this exposure step, the wafer is aligned using the alignment features 11 created in the top silicon layer 36 in the first lithography and etch process.

Figure 12:
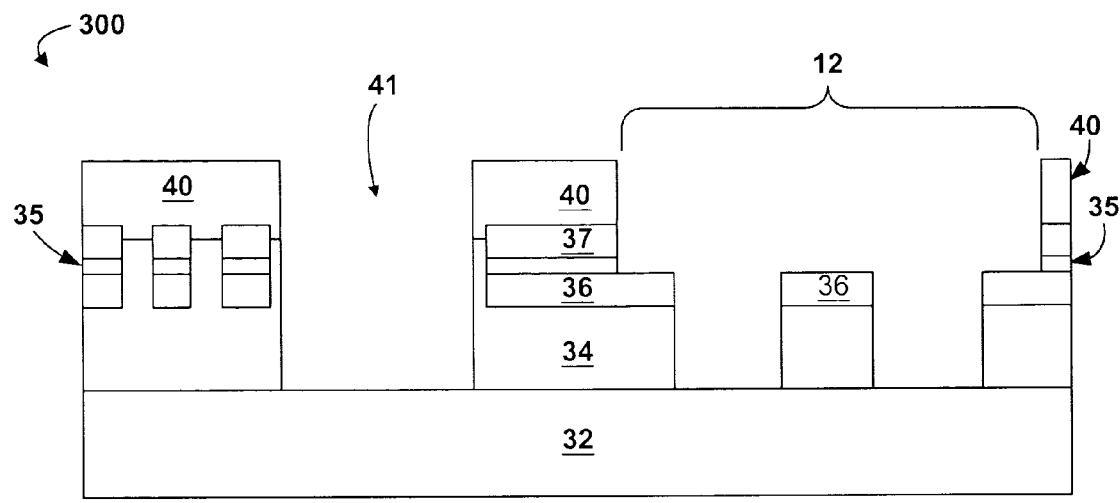

FIG. 12 illustrates the portion 300 of FIG. 11 during the first part of the 'dual window' etch process. Portion 300 is subjected to the first part of a multi-step, anisotropic dry etch process. In an embodiment, the first step of the etch process removes portions of the dielectric layer 37 and insulative layer 34, while being selective to silicon. This first etch step transfers the alignment feature 11 pattern from the STI stack, in which the dielectric layer 37 serves as a hard-mask to define the alignment feature 12 location, down into the buried oxide (insulative) layer 34, and etches the window 41 for the back-side contacts. This first etch also removes the exposed nitride (dielectric) layer 37 over the top silicon layer 36. The etch process stops on lower substrate 32, and on top silicon layer 36. The next etch step, shown in FIG. 13, will etch silicon selectively to oxide.

Figure 13:
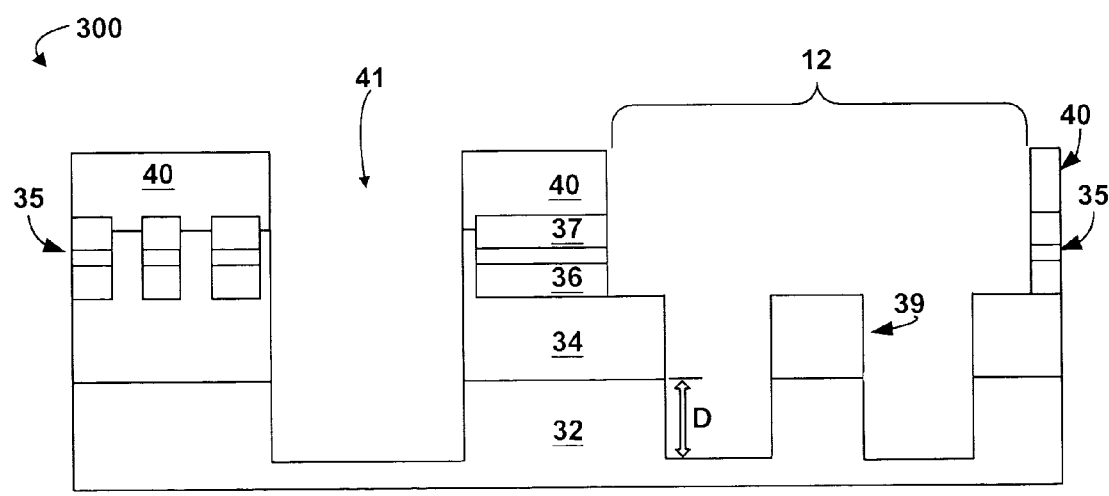

FIG. 13 illustrates the portion 300 of FIG. 12 during the second part of the 'dual window' etch process. The second step etches silicon selective to oxide, and targets an etch depth, D, into the lower substrate 32. Etch depth D should match the desired alignment feature depth for obtaining optical contrast from the stepper/scanner system of interest, e.g., 120 nm for ASML equipment. During the silicon etch step, the BOX pillar 39 acts as a hard-mask for patterning the alignment features 12. The top silicon layer 36 in the in the alignment feature window area is consumed during the silicon etch step, since the thickness of top silicon layer 36 is less than the target etch depth D.

An advantage of the method of the present disclosure is that there are only two patterning steps. A major cost factor in semiconductor manufacturing is the number of times a wafer lot has to undergo photolithography steps, since photolithography processes are quite expensive. Etch processes with multiple steps, even with interruptions in between, are counted as part of a single processing step. In the embodiments presented herein, there is no requirement that etch be done in the same chamber/cluster, but only that two reticules/photolithography steps are used instead of the conventional four.

For the second, or 'dual window' etch process, a variety of plasma etch chemistries could be employed. For example, a mixture of CF4 and CHF3 and argon could be used to etch oxide and nitride selectively over silicon. Then a chemistry using C12 and HBr could be used to etch the alignment features 12 into the silicon substrate 32 to the desired target depth D, while removing the top silicon layer 36, using the remaining BOX pillars 39 as hard-mask.

Figure 14:
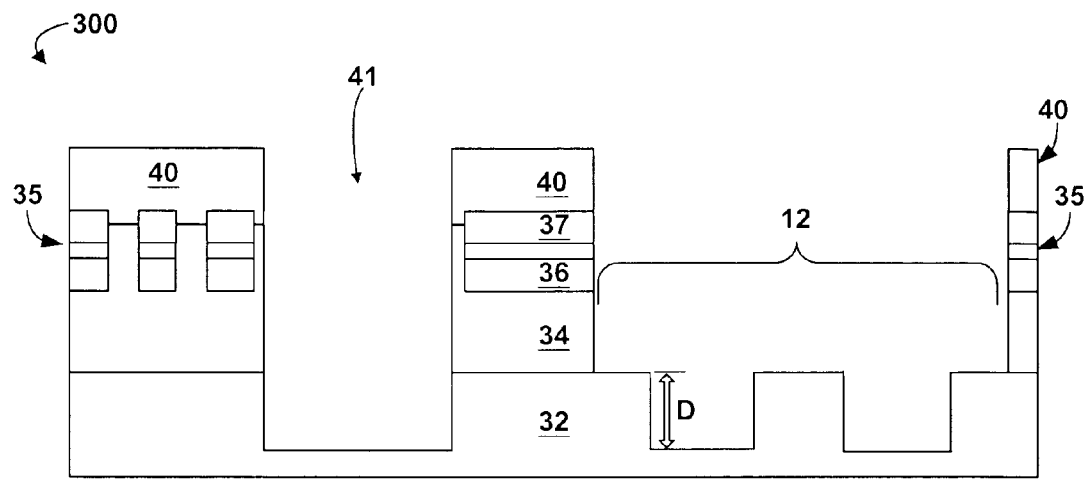

In an embodiment, an optional etch process may be applied to etch oxide selectively over silicon. This additional etch step will result in the removal of the BOX pillars between the alignment features 12, and is shown in FIG. 14. FIG. 14 illustrates the portion 300 of FIG. 13 after the optional oxide etch selective to silicon.

Figure 15:
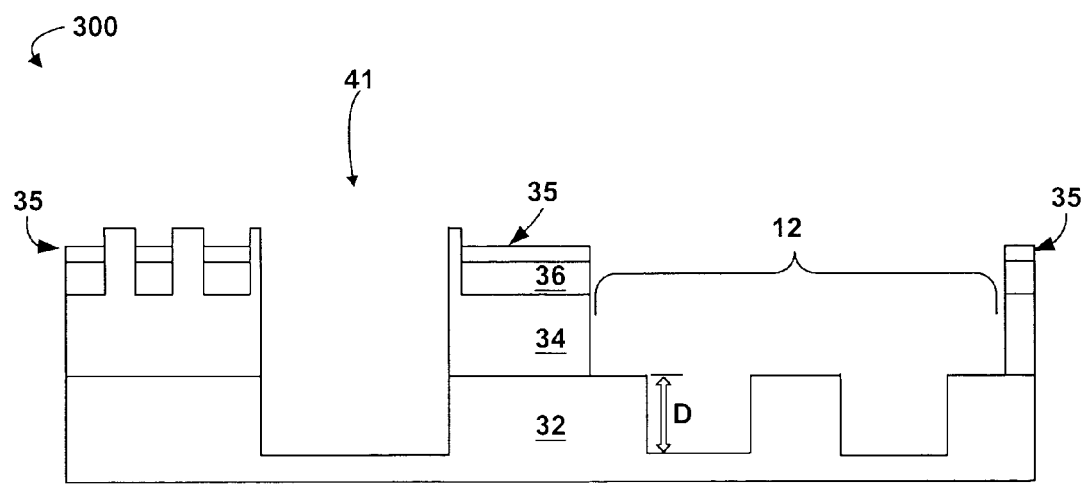

FIG. 15 illustrates portion 300 of FIG. 14 after removal of photo resist and removal of dielectric layer 37. The photo resist mask is removed using standard photo resist stripping techniques. Dielectric layer 37 is removed using standard nitride stripping techniques. Portion 300 is now ready for the standard device process flow. For subsequent lithography steps in the device process flow, alignment features 12 can be used, as they are now the desired target depth, D.

Figure 16:
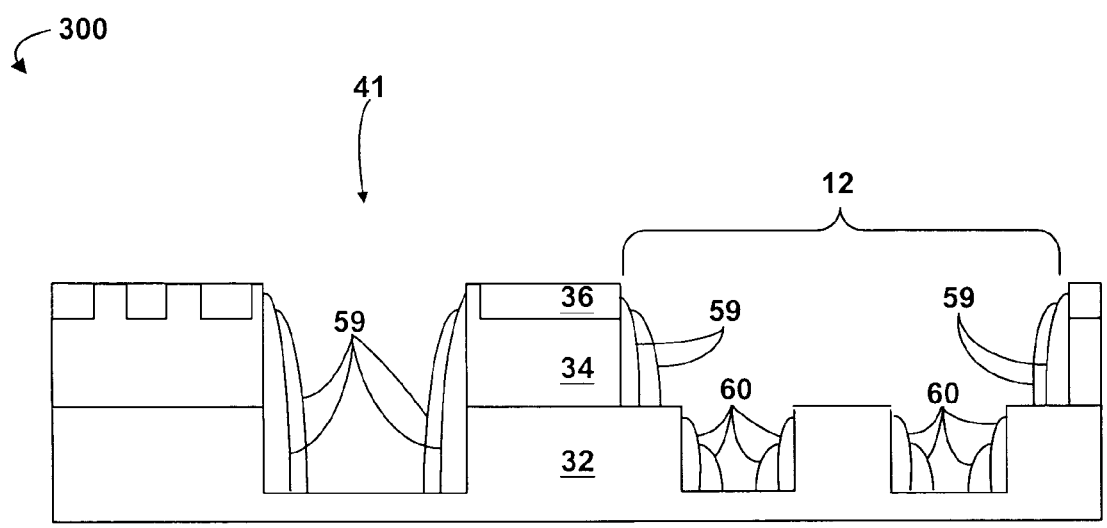

In a standard device process flow, films are deposited over the entire wafer, and then etched back, e.g., gate patterning and gate spacer formation occurs. Due to large step-heights in the topography of portion 300, spacers 59 are formed at the sidewalls of the back-side contact window 41 and alignment feature 12 window, and spacers 60 form at the sidewalls of the alignment features 12 themselves, as seen in FIG. 16. FIG. 16 illustrates portion 300 of FIG. 15 after CMOS transistor formation. Gate and spacer etches have resulted in the formation of gate structure 65, as well as multi-layer spacers 59 and 60. At this point in the fabrication cycle, a device has been manufactured, the device comprising a SOI substrate encompassing a SOI film stack. A conductive portion, with sidewall, electrically connecting the lower substrate 32 to a conductive portion accessible at a surface of the SOI substrate has been constructed. In addition, a multi-layer spacer 59 lying between at least a portion of sidewalls of the conductive portion and a portion of the SOI film stack has been fabricated.

A portion of SOI film stack includes lower or support substrate 32, insulative layer 34, and top silicon layer 36. Insulative layer 34 includes a buried oxide. Lower substrate 32 contains an alignment feature 12, with multi-layered spacers 59 and 60. At least one layer of the multi-layered spacers 59, 60 is polysilicon, and at least one of the multi-layered spacers 59,60 is nitride. The conductive portion accessible at the surface of the SOI substrate is a back-side contact. The window 41 for the back-side contact is shown as being open in FIG. 16, although there are side-wall spacers 59 shown within the window 41. The conductive portion electrically connecting the lower substrate 32 is a conductive portion connecting lower substrate 32 to a metal layer (not shown) overlying the top silicon layer 36.

Formation of multi-layered spacers 59, 60 has no negative impact upon the device, so long as sufficient width exists for back-side window 41 in the initial patterning. Making the back-side contact window 41 a bit wider has a negligible influence on chip size, since the back-side contacts constitute only a minute portion of the overall die.

The embodiments presented thus far have required depositing a photo resist layer overlying an SOI substrate, patterning the first photo resist layer to form a first opening defining a shallow trench isolation feature, an alignment feature, and the location of the back-side contact. After the first pattern-transfer etch process, a second photo resist layer is applied to the SOI substrate. Second photo resist layer is patterned with the openings for the back-side contact, and an opening over the alignment features. This is accomplished in only two patterning steps, whereas conventional processing, as shown with reference to FIGS. 2 through 7, requires four patterning steps. The present disclosure offers the advantage of reducing the number of manufacturing steps, e.g., lithography and etches, and associated operations such as resist strip, cleaning, and measurements. This reduction in patterning steps is accompanied by an attendant reduction in manufacturing cycle time, as well as aiding in increasing yields (fewer steps equates to less opportunities for yield losses). In addition, the present disclosure makes available more manufacturing capacity, as fewer steps require less manufacturing capacity. This could permit a company to reduce or defer the capital expenditures of purchasing more equipment to increase capacity.

A further embodiment of the present disclosure follows much the same process sequence as for FIGS. 8 through 16, but differs in that the back-side contact opening is not included in the photo resist mask for the first lithography process. This particular embodiment is discussed with reference to FIGS. 17 through 25.

Figure 17:
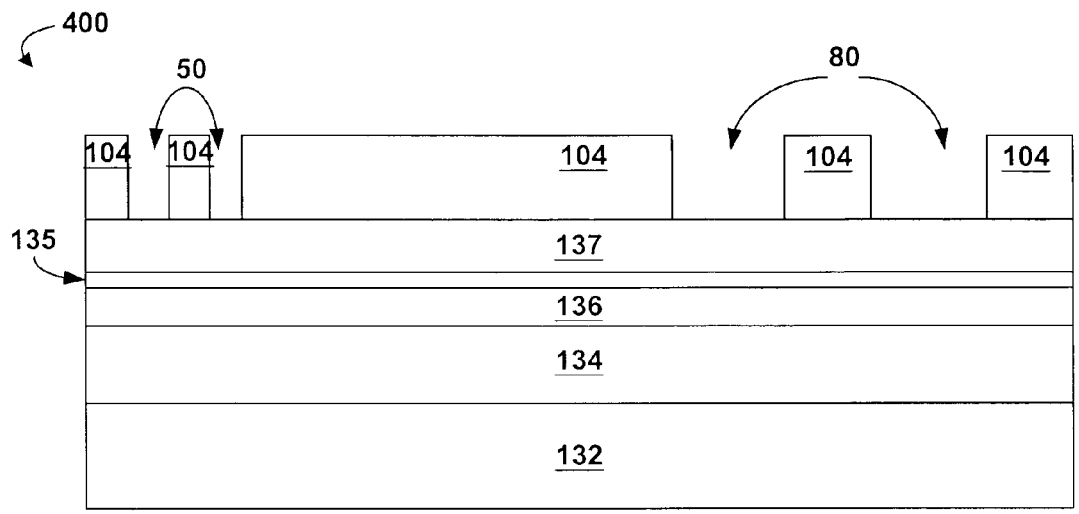

FIG. 17 illustrates a cross-sectional portion 400 of a semiconductor device comprising an SOI wafer substrate. A photo resist mask 104 has been formed over the SOI substrate to define openings 80 at the location of an alignment feature, as well as openings 50 defining a location of a shallow trench isolation feature. SOI substrate comprises a lower substrate 132, an insulative layer 134, and a top silicon layer 137. SOI substrate is preferably a silicon-on-insulator substrate. Alternatively, SOI substrate can also be a semiconductor-on-insulator substrate, silicon on sapphire substrate, or the like. Insulative layer 134 is preferably a buried oxide (BOX).

A buffer layer 135 is grown over the SOI substrate, and then a dielectric layer 137 is deposited. The use of buffer layer 35 is not required to practice the embodiments as disclosed herein. Buffer layer 135 has a thickness ranging between 5 to 20 nm, and is formed of silicon dioxide, preferably through a thermal oxidation process. Following the formation of buffer layer 135, dielectric layer 137 is formed over buffer layer 135. Dielectric layer 137 is preferably LPCVD or PECVD deposited silicon nitride having a thickness ranging from 50 to 200 nm. Alternatively, dielectric layer 37 can also be another material, such as silicon oxynitride.

Buffer layer 135 and dielectric layer 137 are generally called an STI film stack, or an SOI film stack (when the top silicon layer 136, insulative layer 134, and lower substrate 132 are included), or simply a film stack. Photo resist mask 104 is formed over the STI film stack. Mask 104 will pattern STI trenches and alignment features together with one mask, while the area for the back-side contact window is covered with photo resist 104 during the first lithography process. The first lithography process is carried out using alignment of the wafer shape only i.e., center finding and notch finding, as alignment features do not yet exist. As before, the STI stack, and especially dielectric layer 137, acts as an anti-reflective layer during the lithography process.

Figure 18:
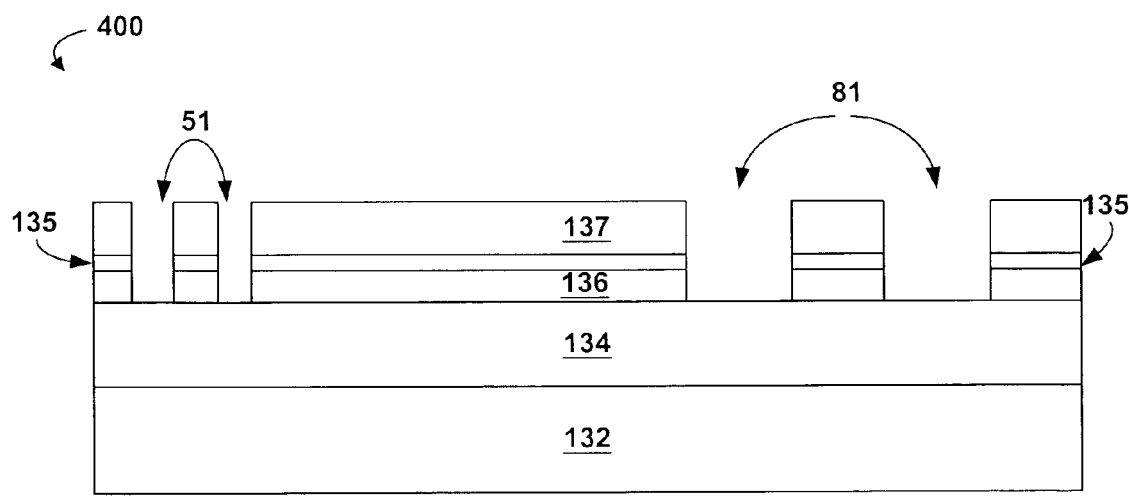

FIG. 18 illustrates the portion 400 of FIG. 17 after etching of the shallow trench isolation feature openings 51 and openings 81 in the top silicon layer 135, and removal of the photo resist mask. Portion 400 of FIG. 18 has been etched in a multi-step, anisotropic dry etch process. The etch process used is typical to that employed for STI etch on SOI material. This multi-step etch transfers the resist mask (104, FIG. 17) pattern into the STI film stack and top silicon layer 136. The etch process is halted upon reaching, or upon etching a small distance into, insulative layer 134. The resist mask is then removed by standard resist stripping techniques.

The STI etch forms at least a portion of an alignment feature by etching each of top silicon layer 136, dielectric layer 137, and buffer layer 135. The STI feature openings 51 are formed at least partially simultaneously with formation of a portion of the alignment feature openings 81. Following formation of STI feature openings 81, and portion of alignment feature 81, the STI trench feature openings 81 will be filled and planarized, as seen in FIG. 19.

Figure 19:
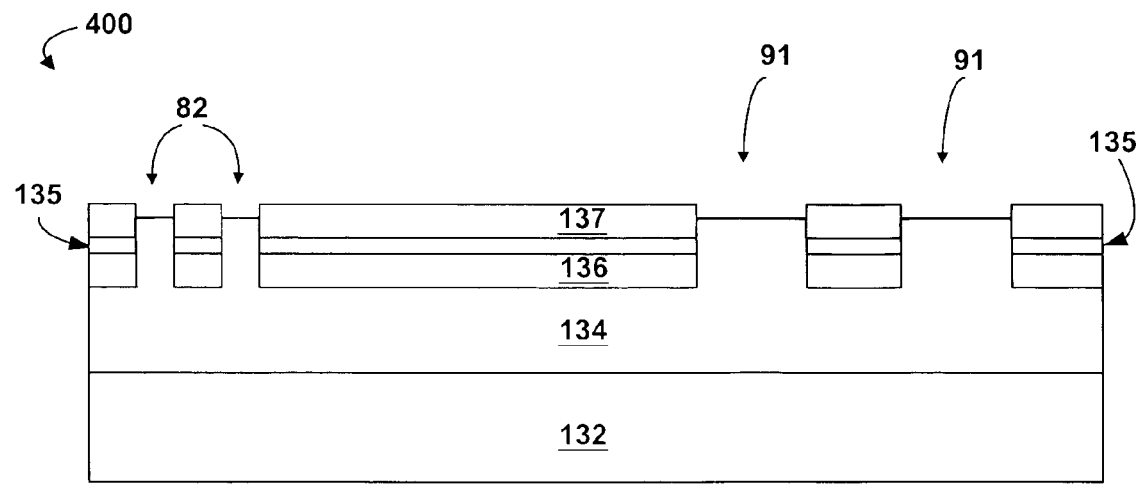

FIG. 19 shows portion 400 of FIG. 18 after STI trench fill of STI features 82 (and openings 91) with silicon oxide, followed by planarization with CMP. The CMP step thins the dielectric layer 137, and, as before, generally leaves a step from the uppermost surface of the dielectric layer 137 to the uppermost surface of the trench fill (silicon oxide). The alignment features 91 etched into top silicon layer 136 will serve to align the wafer during the second lithography step. As was the case in the previous embodiment, the remaining dielectric layer 137 provides sufficient contrast to conduct alignment, due both to an increased thickness over top silicon layer 136 from remaining layer 137, and the anti-reflective properties of the dielectric layer 137 itself. Portion 400 is ready for the next lithography process, as shown in FIG. 20.

Figure 20:
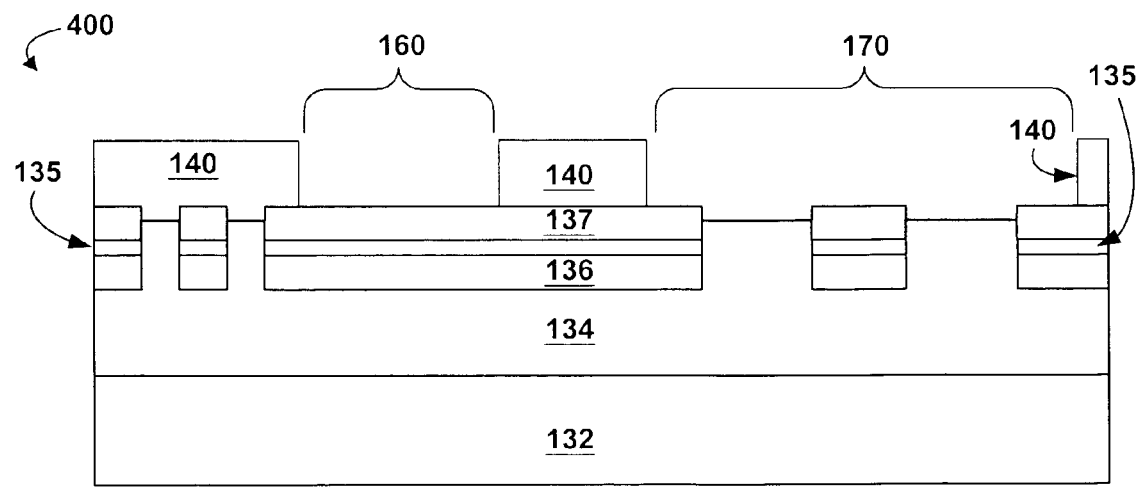

FIG. 20 illustrates the portion 400 of FIG. 19 after lithographic masking with 'dual window' mask 140. Dual window mask 140 is preferably a photo resist mask for patterning openings 160 for back-side contacts and openings 170 for alignment features. For this exposure step, the wafer is aligned using the alignment features 91 previously created in the top silicon layer 136.

Figure 21:
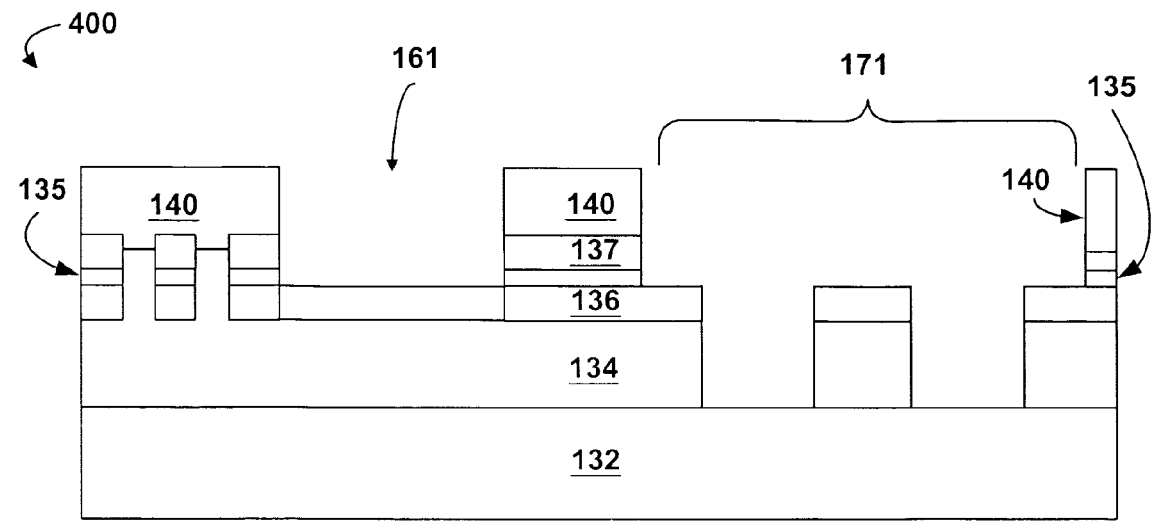

FIG. 21 illustrates the portion 400 of FIG. 20 during the first portion of the 'dual window' etch process. Portion 400 is subjected to a multi-step, anisotropic dry etch. In an embodiment, the first step of the etch process etches nitride and oxide selectively to silicon. This multi-step etch removes portions of the dielectric layer 137, insulative layer 134, and buffer layer 135, while being selective to silicon. This first etch step transfers the alignment feature pattern 171 from the STI stack, which serves as a hard-mask, down into the buried oxide (insulative) layer 134, and etches the opening (window) 161 for the back-side contacts. This first etch also removes the exposed nitride (dielectric) layer 137 over the top silicon layer 136. The etch process stops on lower substrate 132, and on top silicon layer 136. The next etch step, shown in FIG. 22, will etch silicon selectively to oxide.

Figure 22:
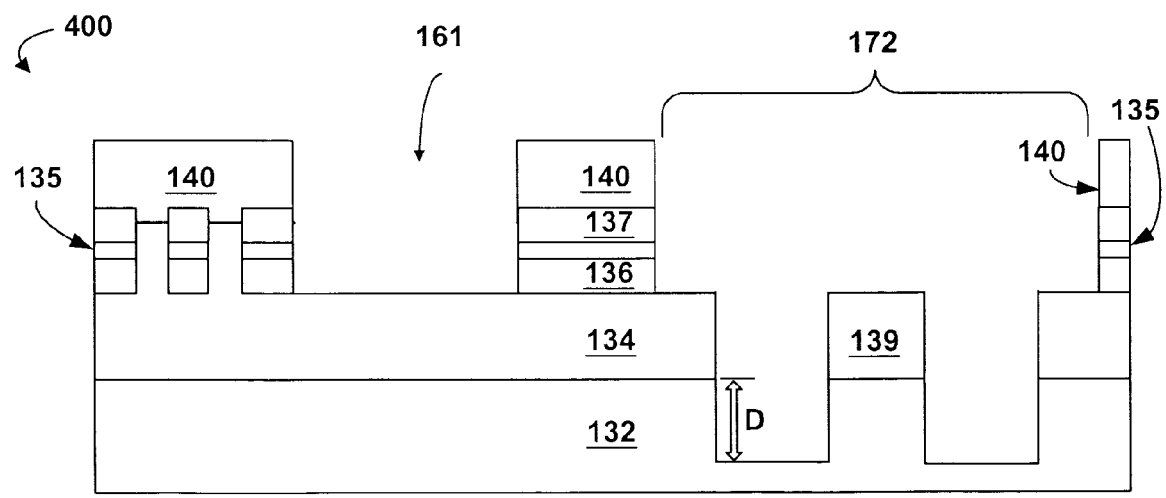

FIG. 22 illustrates the portion 400 of FIG. 21 during the second part of the 'dual window' etch process. The second step etches silicon selectively to oxide, and targets an etch depth, D, into the lower substrate 132. As before, etch depth D should match the desired alignment feature 172 depth for optimizing the optical contrast from a particular stepper/scanner system. Throughout the silicon etch step, BOX pillar 139 acts as a hard-mask for patterning the alignment features 172. At the conclusion of the etch, top silicon layer 136 in the 'dual windows' has been consumed in the alignment feature 172 window area and the back-side contact opening 161.

For the 'dual window' etch process disclosed herein, an assortment of plasma etch chemistries could be employed. For example, a mixture of CF4 and CHF3 and argon could be used to etch oxide and nitride selectively over silicon, followed by a chemistry using Cl2 and HBr to etch the alignment features 172 into the silicon substrate 132 to the desired target depth D, while removing the top silicon layer 136, using the remaining BOX pillars 139 as hard-mask.

Figure 23:
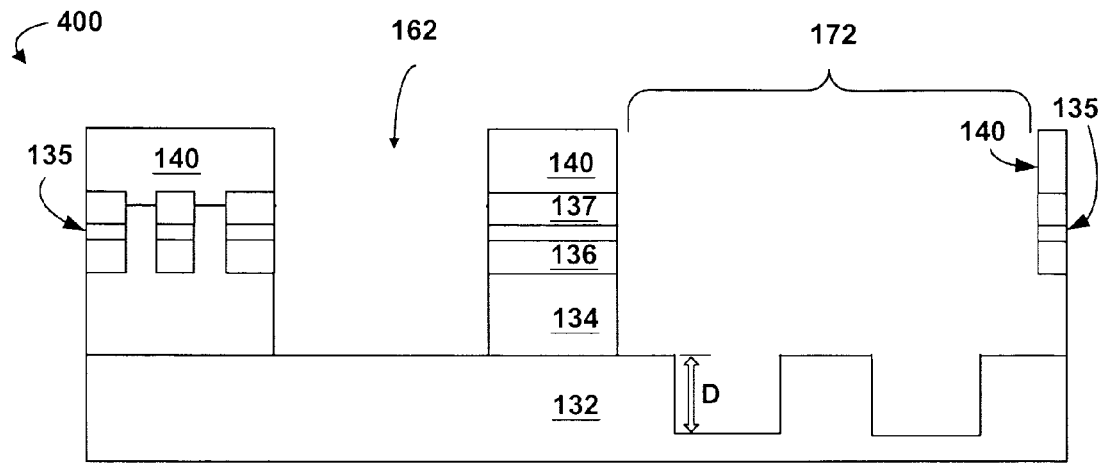

An etch process to etch oxide selectively over silicon results in the removal of the BOX pillar 139 between the alignment features 172, as well as to further open window 162 by removing exposed portions of insulative layer 134, as shown in FIG. 23. FIG. 23 illustrates the portion 400 of FIG. 22 after the oxide etch selective to silicon. Portion 400 will undergo a resist removal and nitride strip, as seen in FIG. 24.

Figure 24:
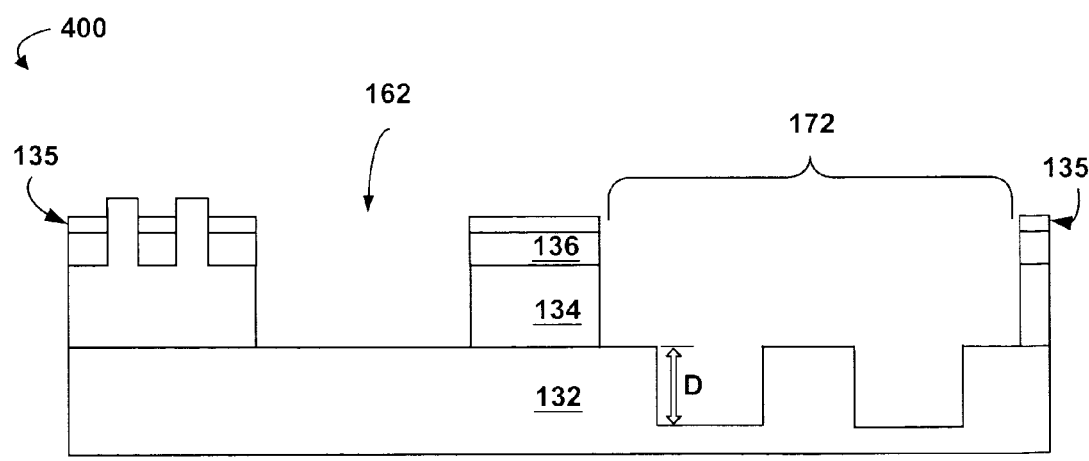

FIG. 24 illustrates portion 400 of FIG. 23 after removal of photo resist and removal of dielectric layer 137. Standard photo resist stripping techniques are used to remove the photo resist mask, and dielectric layer 137 is removed using standard nitride stripping techniques. Portion 400 is now ready for the standard device process flow. For subsequent lithography steps, the alignment features 172 of the desired target depth, D will be utilized.

As before, in a standard device process flow, films are deposited over the entire wafer, and then etched back, e.g., gate patterning and gate spacer formation. As a result of the large step-heights in the topography of portion 400, spacers 159 are formed at the sidewalls of the back-side contact window 162 and alignment feature window, and spacers 166 form at the sidewalls of the alignment features 172 themselves, as seen in FIG. 25.

Figure 25:
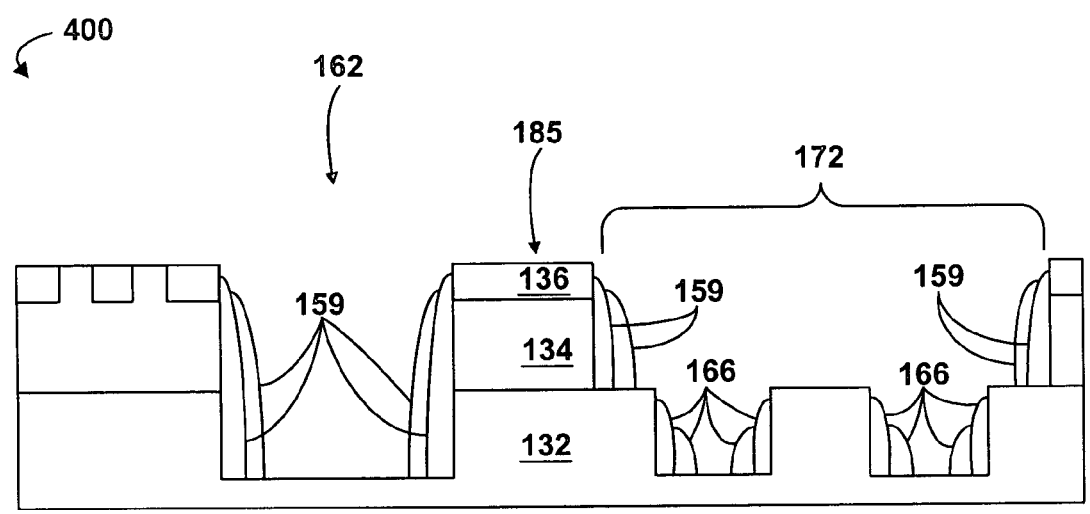

FIG. 25 illustrates portion 400 of FIG. 24 after CMOS transistor formation. Gate and spacer etches have resulted in the formation of gate structure 185, as well as multi-layer spacers 159. In an embodiment, at least one layer of the multi-layered spacers 159, 166 is a nitride, and at least one layer is polysilicon. The presence of multi-layered spacers 159, 166 has no negative impact upon the device, if adequate width is allowed for back-side contact 162 in the initial patterning. As before, increasing the width of back-side contact 162 slightly will not significantly influence chip size, because the back-side contacts 162 represent a minuscule portion of the overall die.

As in the embodiments illustrated in FIGS. 8 through 17, the embodiment illustrated by FIGS. 17 through 25 has required only two patterning steps. Each of these two patterning steps includes lithography and etching, and their associated processes, e.g., resist/nitride stripping, cleaning. This is a process reduction from that of conventional processing, which generally requires four patterning steps to achieve the same results. In the embodiment of FIGS. 17 through 25, the shallow trench isolation features are formed prior to the formation of the back-side contact feature, and simultaneously with the formation of the alignment features. The alignment features are then formed at least partially simultaneously with the formation of the back-side contact features. Further processing to create a CMOS transistor results in the formation of multi-layer sidewall spacers, which do not affect device performance when practiced according to the teachings herein.

The method and apparatus herein provides for a flexible implementation. Although the invention has been described using certain specific examples, it will be apparent to those skilled in the art that the invention is not limited to these few examples. For example, the disclosure is discussed herein primarily with regard to silicon SOI wafers and their alignment mark features, back-side contacts, and shallow trench isolation features, however, the invention can be used with other Semiconductor-On-Insulator materials to create back side contacts, STI features and alignment features that are created by etching processes during device manufacture.

Additionally, various types of deposition and etch devices are currently available which could be suitable for use in employing the method as taught herein. Note also, that although an embodiment of the present invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method comprising:
   forming a mask over an SOI substrate, the mask defining a location of a back-side contact, a shallow trench isolation feature and a location of an alignment feature;
   etching to form at least a portion of a back-side contact opening at the location of the backside contact; and
   etching to form at least a portion of an alignment feature opening at the location of the alignment feature, wherein etching to form at least the portion of the alignment feature opening and at least the portion of the back-side contact opening occur simultaneously.

2. The method of claim 1, wherein the mask is a photo resist mask.

3. The method of claim 1, wherein etching to form the at least the portion of the back-side contact opening includes etching a top silicon layer.

4. The method of claim 3, wherein etching to form the at least the portion of the back-side contact opening includes etching an insulative layer.

5. The method of claim 3, wherein etching to form the at least the portion of the back-side contact opening includes etching a lower substrate.

6. The method of claim 1, wherein etching to form the at least the portion of the alignment feature includes etching a top silicon layer.

7. The method of claim 1, wherein etching to form the at least the portion of the alignment feature includes etching an insulative layer.

8. The method of claim 1, wherein etching to form the at least the portion of the alignment features includes etching a lower substrate.

9. The method of claim 1, wherein a portion of the mask is a photo resist mask defining the location of the back-side contact and a portion of the mask is an dielectric layer defining the alignment feature location.

10. The method of claim 9, wherein the dielectric layer comprises a nitride.

11. A method comprising:
    depositing a photo resist layer overlying an SOI substrate;
    patterning the photo resist layer to form a first opening to define a location of a back-side contact; and
    patterning the photo resist layer to form a second opening to define a location of an alignment feature and third opening to define a location of a shallow trench isolation feature.

12. The method of claim 11, wherein the SOI substrate includes a top silicon layer, an insulative layer, a lower substrate, and a buffer layer.

13. A method comprising:
forming a back-side contact feature over an SOI substrate;
forming an alignment feature at least partially simultaneously with forming the back-side contact feature; and
forming a shallow trench isolation feature at least partially simultaneously with the formation of the back-side contact feature and the alignment feature.

14. The method of claim 13, wherein the shallow trench isolation feature is formed prior to the formation of the back-side contact feature.

15. A method comprising:
forming a mask over an SOI substrate, the mask defining a location of a back-side contact, and a location of an alignment feature, wherein a portion of the mask is a photo resist mask defining the location of the back-side contact and a portion of the mask is a dielectric layer comprising nitride defining the alignment feature location, wherein at least a portion of the location of the backside contact is not defined by the portion of the mask that is a dielectric layer comprising nitride;
etching to form at least a portion of a back-side contact opening at the location of the backside contact; and
etching to form at least a portion of an alignment feature opening at the location of the alignment feature, wherein etching to form at least the portion of the alignment feature opening and at least the portion of the back-side contact opening occur simultaneously.

* * * * *